(12) United States Patent
Ramey et al.

(10) Patent No.: US 6,479,765 B2
(45) Date of Patent: Nov. 12, 2002

(54) VIALESS PRINTED CIRCUIT BOARD

(75) Inventors: Samuel C. Ramey, Naperville, IL (US); Alexander W. Barr, Louisville, KY (US)

(73) Assignee: Robinson Nugent, Inc., New Albany, IN (US)

( * ) Notice: Subject to any disclaimer, the term of this patent is extended or adjusted under 35 U.S.C. 154(b) by 0 days.

(21) Appl. No.: 09/887,815

(22) Filed: Jun. 22, 2001

(65) Prior Publication Data

US 2002/0017397 A1 Feb. 14, 2002

Related U.S. Application Data

(60) Provisional application No. 60/214,191, filed on Jun. 26, 2000.

(51) Int. Cl.$^7$ ................................................ H01R 9/09
(52) U.S. Cl. ........................ 174/262; 174/263; 29/852; 361/795
(58) Field of Search ................. 174/261, 202, 174/263, 264, 266; 428/901; 361/767, 794, 795; 29/825, 837, 852

(56) References Cited

U.S. PATENT DOCUMENTS

| | | | | |
|---|---|---|---|---|
| 3,400,210 A | | 9/1968 | Reimer | |
| 4,935,284 A | * | 6/1990 | Puerner | 428/901 |
| 5,774,340 A | * | 6/1998 | Chang et al. | 174/266 |
| 5,961,349 A | * | 10/1999 | Paagman | 439/607 |
| 6,075,211 A | * | 6/2000 | Tohya et al. | 361/794 |

* cited by examiner

*Primary Examiner*—Albert W. Paladini
(74) *Attorney, Agent, or Firm*—Barnes & Thornburg

(57) ABSTRACT

A method is disclosed for establishing signal contacts on a multilayer printed circuit board having alternating ground and signal layers in a stack-up configuration. The signal layers have signal pads and conductive traces leading away from the pads. The method comprises the steps of: a) drilling blind signal holes in the printed circuit board down to signal pads on successive signal layers, b) filling the blind signal holes with conductive material, and c) removing strips of the printed circuit board nearly down to successive signal layers to provide on each signal layer a strip of exposed signal contacts for the conductive traces thereon.

10 Claims, 4 Drawing Sheets

VIALESS PRINTED CIRCUIT BOARD

CROSS-REFERENCE TO RELATED APPLICATION

This application claims the benefit of U.S. Provisional Patent Application, Serial No. 60/214,191, filed on Jun. 26, 2000.

BACKGROUND AND SUMMARY OF THE INVENTION

The present invention generally relates to printed circuit boards, and, more particularly, the present invention relates to printed circuit boards having plated vias or holes.

Multilayer printed circuit boards have difficulty carrying high-speed signals through vias. Vias are plated holes in the printed circuit boards used to connect one or more layers together either to change layers for signal routing purposes or to connect them for common grounding. Vias are also used to connect surface mount pads for surface mount components to internal layers, and also for connecting solder tail or press-fit tail components to the boards. The reason vias create difficulties in carrying high-speed signals is that they exhibit stray capacitance within the electrical path because of the plated barrel's proximity to inner conducting layers, such as ground and power layers. This stray capacitance creates an impedance discontinuity relative to the circuit board which causes a portion of the high speed signal to be reflected. These reflections traveling through the transmission system can cause false clocking of the digital signals, and may cause a receiver chip to switch erroneously. To reduce the stray capacitance, one may reduce the length of the plated vias by counterboring the backside of the boards. However, counterboring does not allow routing of signals to layers near the bottom of a printed circuit board stack-up, thus greatly reducing signal routing possibilities. Necking down the vias also reduces the stray capacitance, but only slightly by reducing the surface area of the plated barrel and increasing barrel's separation from other conducting layers.

According to one aspect of the present invention, a method is disclosed for substantially eliminating the stray capacitance exhibited by a via in a printed circuit board by successively milling off adjacent strips of the printed circuit board to provide on each signal layer a strip of exposed contacts for the conductive traces thereon.

According to another aspect of the present invention, a method is disclosed for establishing contacts on a multilayer printed circuit board having a ground, signal, ground, signal and ground stack-up configuration. The individual signal layers have signal pads and conductive traces leading away from the pads. The method includes the steps of: a) drilling blind signal holes in the printed circuit board down to signal pads on successive signal layers, b) drilling through ground holes in the printed circuit board through the ground layers, c) filling the holes with conductive material, and d) removing adjacent strips of the printed circuit board nearly down to successive signal and ground layers to provide on each signal and ground layer a strip of exposed contacts. In accordance with a further aspect of the present invention, the removing step comprises the step of milling off adjacent strips of the printed circuit board nearly down to successive signal and ground layers to provide on each signal and ground layer a strip of exposed contacts.

Most high speed multilayer printed circuit boards carry differential circuits that are edge-to-edge coupled in a stripline configuration (i.e., the layers are alternately ground and signal in a sandwich configuration). The technique of the present invention is particularly suited for this application, although not limited to it.

Additional features of the present invention will become apparent to those skilled in the art upon a consideration of the following detailed description of the preferred embodiments exemplifying the best mode of carrying out the invention as presently perceived.

BRIEF DESCRIPTION OF THE DRAWINGS

The detailed description particularly refers to the accompanying figures in which.

DETAILED DESCRIPTION OF THE DRAWINGS

Figure 1:
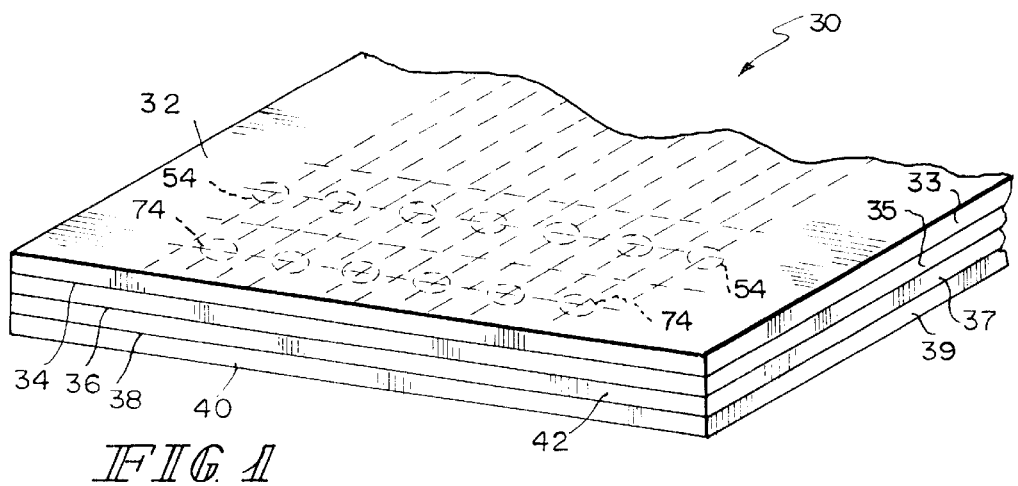
FIG. 1 is a perspective view showing a multilayer printed circuit board having ground, signal, ground signal and ground stack-up configuration, and showing the top ground layer having two rows of clearance areas (shown in phantom) corresponding to the two rows of signal pads in the signal layers below.
Figure 3:
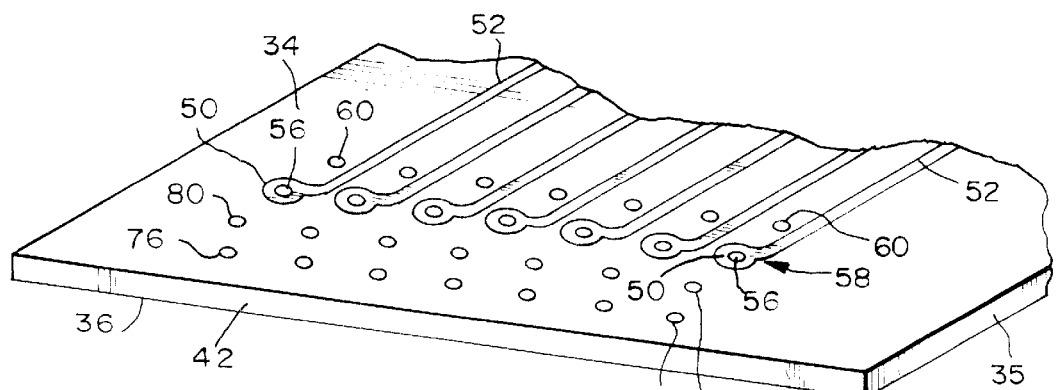
FIG. 3 is a perspective view showing the top signal layer after drilling the signal and ground holes, and showing a row of signal pads spaced from a bottom edge of the printed circuit board and conductive traces leading away from the pads, and showing two rows of signal holes—one row of signal holes drilled down to the signal pads in the top signal layer and which is spaced apart from the bottom edge of the board, and one row of signal holes drilled down to the signal pads in the bottom signal layer and which is adjacent to the bottom edge of the board, and further showing two rows of ground holes drilled through the board, the ground holes spaced most distant from the bottom edge being disposed between the conductive traces in a staggered configuration.
Figure 4:
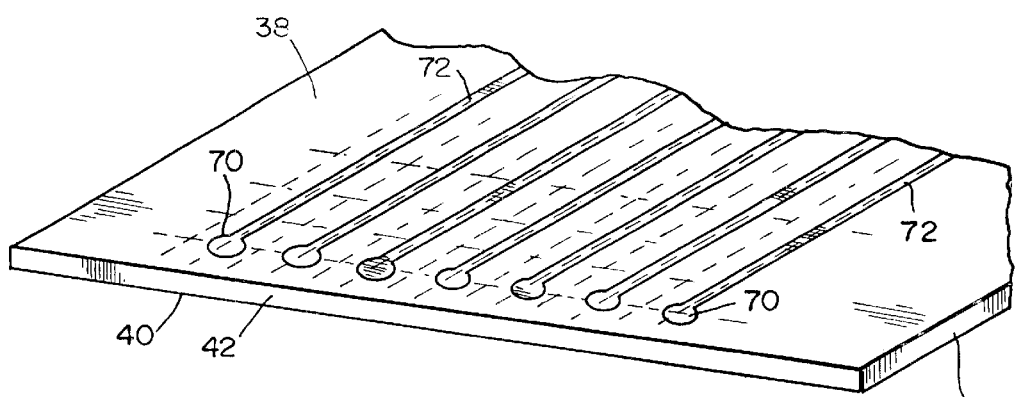
FIG. 4 is a perspective view showing the bottom signal layer before drilling the signal and ground holes, and showing a row of signal pads adjacent to the bottom edge of the board, and conductive traces leading away from the pads.
Figure 7:
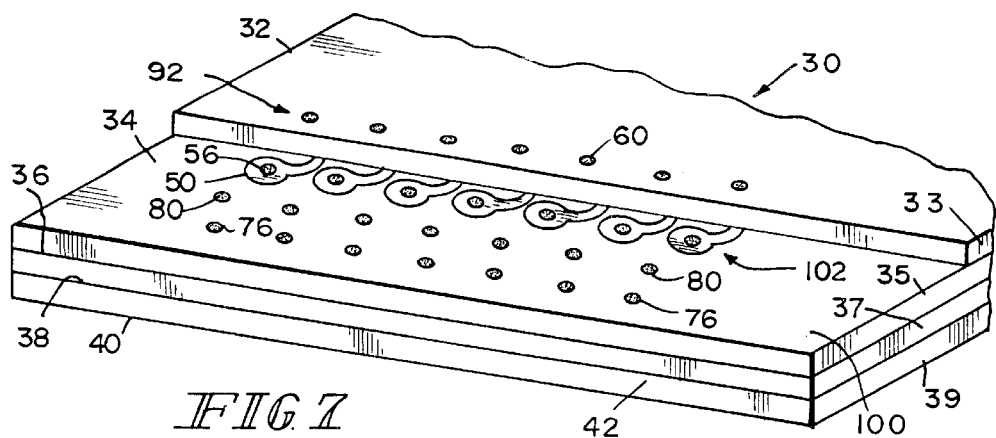
FIG. 7 is a perspective view similar to FIG. 6 showing the printed circuit board having a first, relatively wide strip milled off nearly down to the top signal layer to establish a row of signal contacts for the top signal layer.

As shown in the drawings, a multilayer printed circuit board 30 made of insulating material includes a ground layer 32 (G1), a signal layer 34 (S1), a ground layer 36 (G2), a signal layer 38 (S2) and a ground layer 40 (G3). The layers 32–40 are alternately ground and signal, and are arranged in a stack-up, sandwich configuration. The multilayer printed circuit board 30 comprises four printed circuit boards 33, 35, 37 and 39 stacked on top of each other and joined together using conventional lamination techniques. As shown in FIG. 3, the top signal layer 34 (also sometimes referred to herein as the upper signal layer) includes a row of signal pads 50 spaced apart from a bottom edge 42 of the printed circuit board 30 and conductive traces 52 leading away from the pads 50. As shown in FIG. 4, the bottom signal layer 38 (also sometimes referred to herein as the lower signal layer) includes a row of signal pads 70 adjacent to the bottom edge 42 of the board 30 and conductive traces 72 leading away from the pads 70. The signal pads 50, 70 and conductive traces 52, 72 are etched in the signal layers 34, 38 in a conventional manner. As shown in FIG. 1, the top ground layer 32 has two rows of clearance or keepout areas 54, 74 (shown in phantom) that are vertically aligned with the signal pads 50, 70 in the two signal layers 34, 38 below. Although the clearance areas 54, 74 are established on the top ground layer 32 in the embodiment shown for illustration purposes, they are not needed. It will be noted that only the inner ground layers that have signal holes or vias passing through them in portions thereof that will not be milled away need to have clearance areas. As explained below, the clearance areas 54, 74 are milled away during a first milling pass as shown in FIG. 7.

Figure 2:
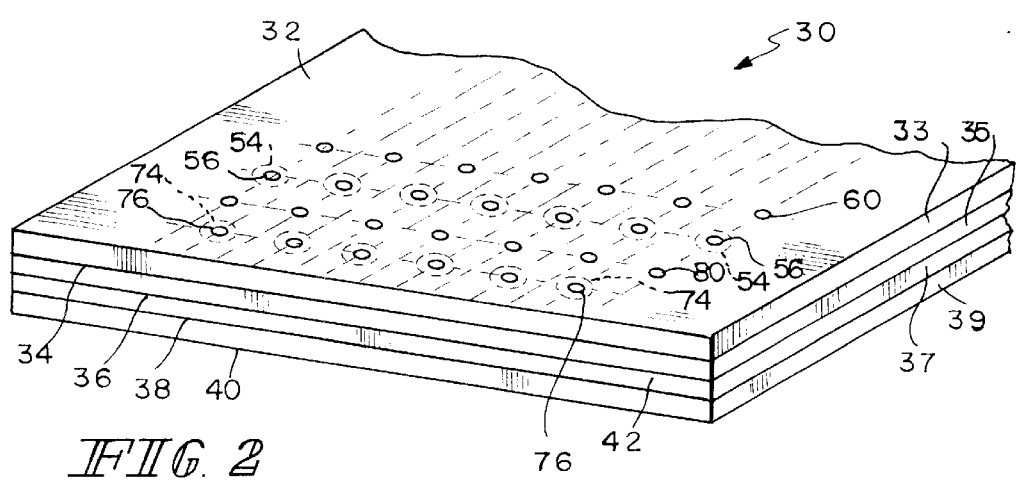
FIG. 2 is a perspective view similar to FIG. 1 showing the multilayer printed circuit board having two rows of blind signal holes drilled down to the signal pads on the top and bottom signal layers, and having two rows of through ground holes drilled through the entire multilayer printed circuit board stack-up, the rows of signal holes alternating with the rows of ground holes.
Figure 5:
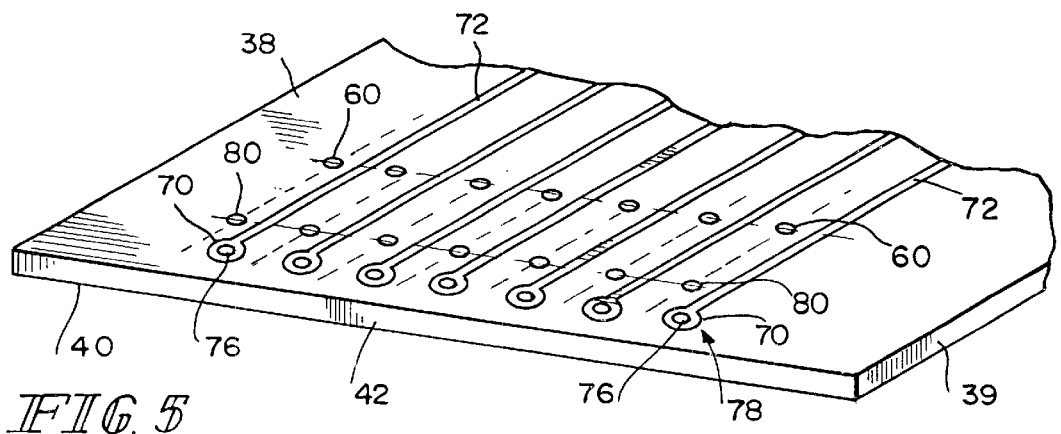
FIG. 5 is a perspective view similar to FIG. 4 showing the bottom signal layer after drilling the signal and ground holes, and showing one row of signal holes drilled down to the signal pads in the bottom signal layer and which is adjacent to the bottom edge of the board, and further showing two rows of ground holes drilled through the printed circuit board, the ground holes alternating with the conductive traces in a staggered configuration.

As shown in FIG. 2, the printed circuit board 30 is then drilled using a precision, controlled depth drilling technique to produce blind holes or vias 56, 76 (also referred to herein as signal holes). The signal holes 56 are drilled down to the signal pads 50 on the top signal layer 34. The signal holes 56 are spaced apart from the bottom edge 42 of the board 30 as illustrated. Likewise, the signal holes 76 are drilled down to the signal pads 70 on the bottom signal layer 38. The signal holes 76 are located adjacent to the bottom edge 42 of the board 30 as illustrated. It is desirable to drill the signal holes 56, 76 just beyond the respective signal layers 34, 38 to ensure good signal contact with the respective conductive pads 50, 70 as shown at 58, 78 as shown in FIGS. 3 and 5. The printed circuit board 30 is also drilled to provide two rows of through ground holes 60, 80 that are drilled through the entire multilayer stack-up. The ground holes 60, 80 alternate with the signal holes 56, 76 as best shown in FIG. 2. The ground holes 60, 80 are disposed in the spaces between the conductive traces 52, 72 as shown in FIGS. 3 and 5.

FIG. 3 is a perspective view showing the upper signal layer 34 having two rows of signal holes 56, 76 drilled down to the signal pads 50, 70 in the upper and lower signal layers 34 and 38, and two rows of ground holes 60, 80 drilled through the printed circuit board 30. FIG. 5 is a perspective view similar to FIG. 3 showing the lower signal layer 38 having one row of signal holes 76 drilled down to the signal pads 70 in the lower signal layer 38, and two rows of ground holes 60, 80 drilled through the printed circuit board 30.

Figure 6:
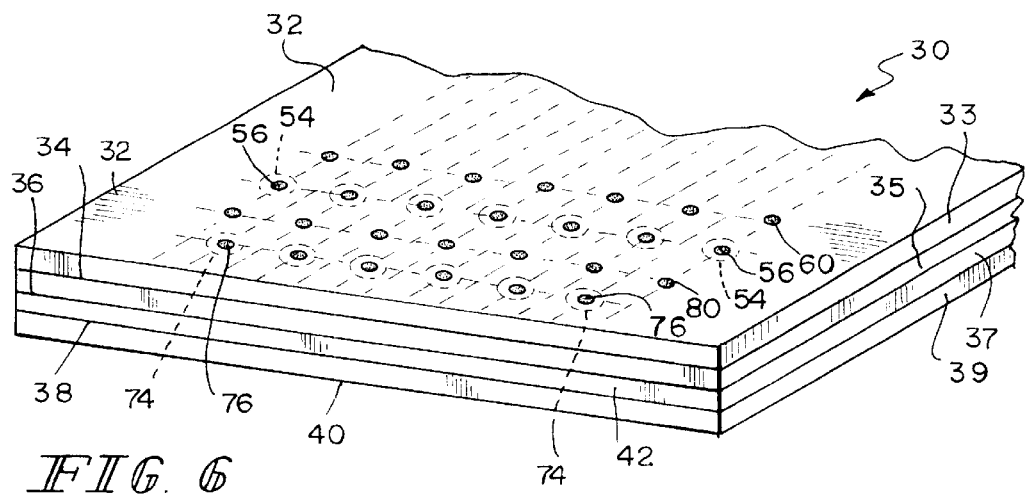
FIG. 6 is a perspective view similar to FIG. 2 showing the two rows of signal holes and the two rows of ground holes plated with conductive plating material, and further showing annular clearance areas (shown in phantom) surrounding the two rows of signal holes.

The printed circuit board 30 is then plated to fill the blind signal holes 56, 76 and the through ground holes 60, 80 with conductive plating material as shown in FIG. 6. In the illustrated embodiment, the signal and ground holes 56, 76 and 60, 80 are plated solid. However, instead of plating the signal and ground holes 56, 76 and 60, 80 solid, they may be plated around their inside surfaces as is normally done. The blind signal holes 56, 76 are surrounded by annular clearance areas 54, 74 (shown in phantom) as best shown in FIG. 6. As previously indicated, the clearance areas 54, 74 are milled away during a first milling pass, and are not needed.

Figure 8:
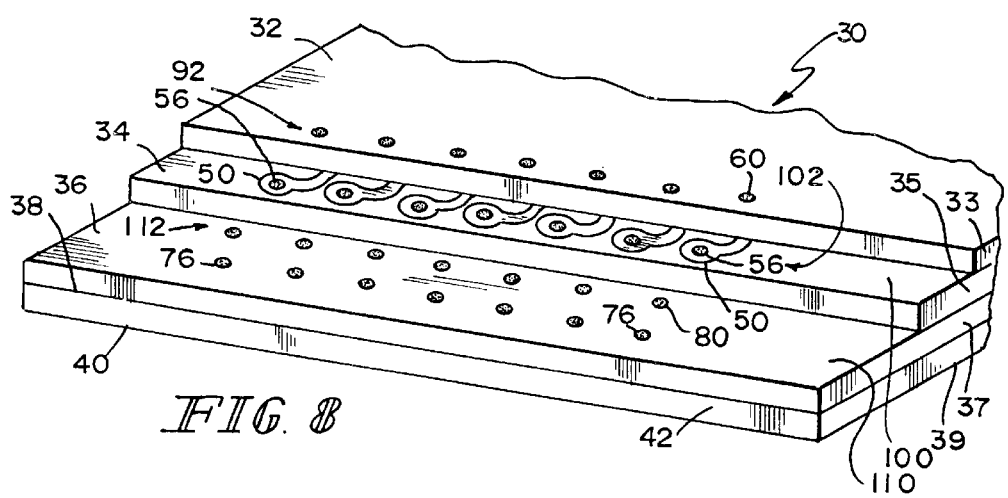
FIG. 8 is a perspective view similar to FIG. 7 showing the printed circuit board having a second intermediate strip milled off nearly down to the intermediate ground layer to establish a row of ground contacts for the intermediate ground layer.
Figure 9:
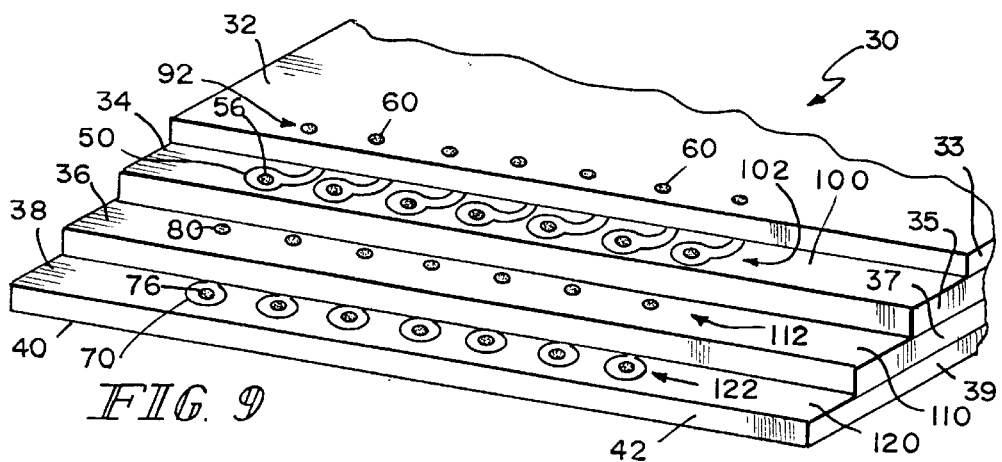
FIG. 9 is a perspective view similar to FIG. 8 showing the printed circuit board having a third relatively narrow strip milled off nearly down to the bottom signal layer to establish a row of signal contacts for the bottom signal layer.

The board 30 has adjacent strips 100, 110 and 120 milled away nearly down to successive signal and ground layers 34, 36 and 38 to provide thereon strips of exposed contacts 102, 112 and 122. As shown in FIG. 7, a first, relatively wide strip 100 of the board 30 is milled off during a first pass adjacent to the bottom edge 42 of the board 30 nearly down to the upper signal layer 34 to establish a row of signal contacts 102 thereon. As shown in FIG. 8, a second intermediate strip 110 of board 30 is milled off during a second pass adjacent to the bottom edge 42 of the board 30 nearly down to the intermediate ground layer 36 to establish a row of ground contacts 112 thereon. As shown in FIG. 9, a third relatively narrow strip 120 of board 30 is milled off during a third pass adjacent to the bottom edge 42 of the board 30 nearly down to the lower signal layer 38 to establish a row of signal contacts 122 thereon. The through ground holes 60 filled with the conductive material establish a row of ground contacts 92 thereon for the top and bottom ground layers 32 and 40 as shown in FIG. 9.

Figure 10:
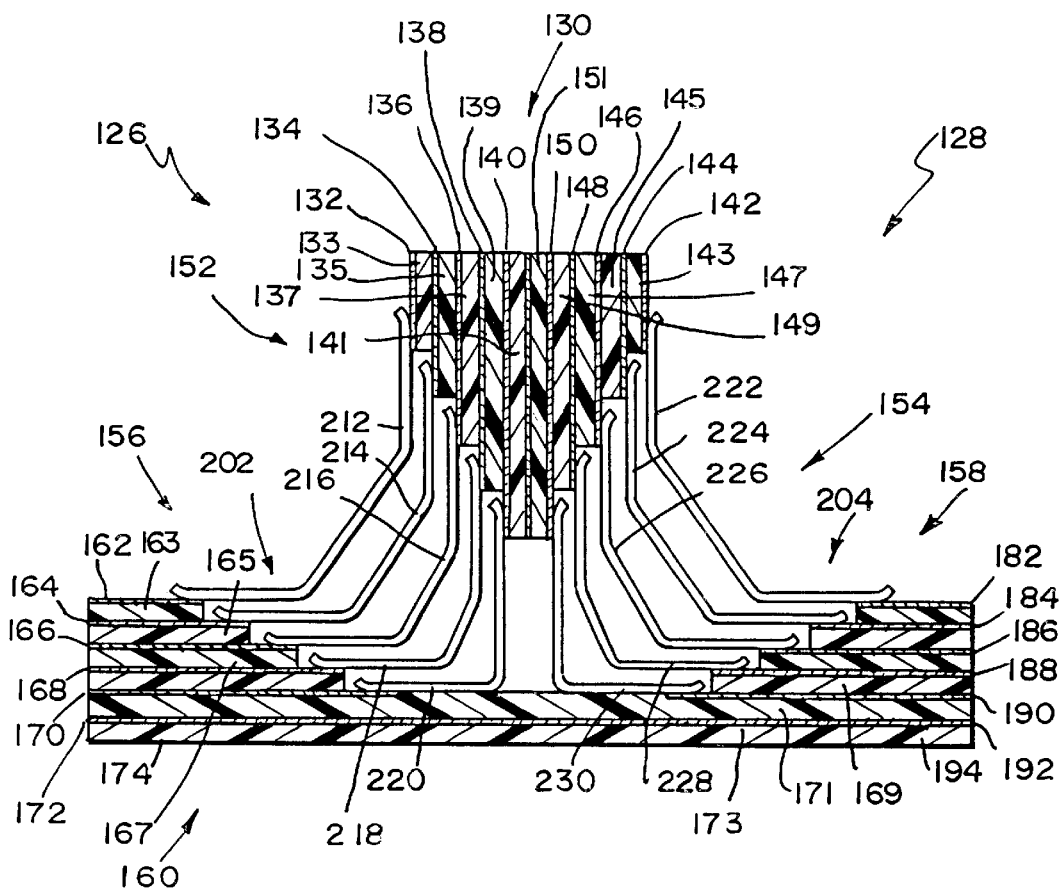
FIG. 10 is a diagrammatic view showing a structure comprising two multilayer printed circuit boards having stripline configurations—one vertical and one horizontal, and showing the vertical printed circuit board having contacts arranged in a stepwise configuration on both sides near a bottom edge thereof and the horizontal printed circuit board having two sets of oppositely-disposed contacts arranged in a stepwise configuration in the middle of the board.

It is desirable to attach a component (such as a connector) directly onto the respective layers of a printed circuit board without having a plated via for making the connection. The printed circuit board manufacturing technique described above virtually eliminates the via, and the accompanying stray capacitance, thus enabling the printed circuit board to carry high speed signals. As shown in FIG. 10, this technique can be used on both sides of a printed circuit board 130 to create a pyramid-shaped structure near a top or bottom edge thereof, exposing multiple rows of signal and ground contacts. In addition, the technique can be applied in the middle of a printed circuit board 160, instead of at its edges, to attach components at a more convenient location on the board as shown. Using this technique with connectors, one may build a very high speed system that would not have the limitations posed by the impedance discontinuity created by the stray capacitance of the vias.

FIG. 10 shows two multilayer printed circuit boards having stripline configurations—one vertical 130 and one horizontal 160. A first side 126 of the vertical printed circuit board 130 includes a ground layer 132 (G1), a signal layer 134 (S1), a ground layer 136 (G2), a signal layer 138 (S2) and a ground layer 140 (G3). Likewise, a second side 128 of the vertical printed circuit board 130 includes a ground layer 142 (G1), a signal layer 144 (S1), a ground layer 146 (G2), a signal layer 148 (S2) and a ground layer 150 (G3). The vertical printed circuit board 130 comprises ten printed circuit boards 133, 135, 137, 139, 141, 143, 145, 147, 149 and 151 stacked and joined together using conventional lamination techniques. The first side 126 of the vertical printed circuit board 130 has five rows of signal and ground contacts 152. Likewise, the second side 128 of the vertical printed circuit board 130 has five rows of signal and ground contacts 154.

A first side 156 of the horizontal printed circuit board 160 includes a ground layer 162 (G1), a signal layer 164 (S1), a ground layer 166 (G2), a signal layer 168 (S2), a ground layer 170 (G3), a signal layer 172 (S3) and a ground layer 174 (G4). Likewise, a second side 158 of the horizontal printed circuit board 160 includes a ground layer 182 (G1), a signal layer 184 (S1), a ground layer 186 (G2), a signal layer 188 (S2), a ground layer 190 (G3), a signal layer 192 (S3) and a ground layer 194 (G4). The horizontal printed circuit board 160 comprises six printed circuit boards 163, 165, 167, 169, 171 and 173 stacked on top of each other and joined together using conventional lamination techniques. The first side 156 of the horizontal printed circuit board 160 has five rows of signal and ground contacts 202. Likewise, the second side 158 of the horizontal printed circuit board 130 has five rows of signal and ground contacts 204. A first set of five conductors 212, 214, 216, 218 and 220 couple the five rows of contacts 152 on the first side 126 of the vertical printed circuit board 130 with the five rows of contacts 202 on the first side 156 of the horizontal printed circuit board 160. Likewise, a second set of five conductors 222, 224, 226, 228 and 230 couple the five rows of contacts 154 on the second side 128 of the vertical printed circuit board 130 with the five rows of contacts 204 on the second side 158 of the horizontal printed circuit board 160.

Although the present invention has been described in detail with reference to certain preferred embodiments, variations and modifications exist within the scope and spirit of the present invention as described above.

What is claimed is:

1. A method of establishing contacts on a multilayer printed circuit board having alternating ground and signal layers in a stack-up configuration, the signal layers having signal pads and conductive traces leading away from the pads, the method comprising the steps of:
    a) drilling blind signal holes in the printed circuit board down to signal pads on successive signal layers,
    b) drilling through ground holes in the printed circuit board through the ground layers,
    c) filling the holes with conductive material, and
    d) removing adjacent strips of the printed circuit board nearly down to successive signal and ground layers to provide on each signal and ground layer a strip of exposed contacts.

2. A method of establishing contacts on a multilayer printed circuit board having alternating ground and signal layers in a stack-up configuration, the signal layers having signal pads and conductive traces leading away from the pads, the method comprising the steps of:
    a) drilling blind signal holes in the printed circuit board down to signal pads on successive signal layers,
    b) drilling through ground holes in the printed circuit board through the ground layers,
    c) plating the holes with conductive plating material, and
    d) milling off adjacent strips of the printed circuit board nearly down to successive signal and ground layers to provide on each signal and ground layer a strip of exposed contacts.

3. A method of establishing signal contacts on a multilayer printed circuit board having alternating ground and signal layers in a stack-up configuration, the signal layers having signal pads and conductive traces leading away from the pads, the method comprising the steps of:
    a) drilling blind signal holes in the printed circuit board down to signal pads on successive signal layers,
    b) filling the holes with conductive material, and
    c) removing strips of the printed circuit board nearly down to successive signal layers to provide on each signal layer a strip of exposed signal contacts for the conductive traces thereon.

4. A method of establishing contacts on a multilayer printed circuit board having a ground layer, a signal layer and a ground layer in a stack-up configuration, the signal layer having signal pads and conductive traces leading away from the pads, the method comprising the steps of:
    a) drilling blind signal holes in the printed circuit board down to signal pads on the signal layer,
    b) drilling through ground holes in the printed circuit board through the ground layers,
    c) filling the holes with conductive material, and
    d) milling off a strip of the printed circuit board nearly down to the signal layer to provide a strip of exposed signal contacts on the signal layer for the conductive traces thereon.

5. A method of establishing contacts on a multilayer printed circuit board having alternating ground and signal layers in a stack-up configuration, the signal layers having signal pads and conductive traces leading away from the pads, the method comprising the steps of:
    a) drilling blind signal holes in the printed circuit board down to signal pads on the signal layers,
    b) drilling through ground holes in the printed circuit board through the ground layers,
    c) filling the holes with conductive material,
    d) milling off adjacent strips of the printed circuit board nearly down to successive signal and ground layers to provide on each signal and ground layer a strip of exposed contacts, and
    e) providing the ground layers having signal holes passing through them with clearance areas around the signal holes if such clearance areas fall in portions of the printed circuit board that will not be milled off.

6. A method of establishing signal and ground contacts on a multilayer printed circuit board having a ground layer, a signal layer, a ground layer, a signal layer and a ground layer in a stack-up configuration, top and bottom signal layers having signal pads and conductive traces leading away from the pads, the method comprising the steps of:
    a) drilling blind signal holes in the printed circuit board down to signal pads on the signal layers,
    b) drilling through ground holes in the printed circuit board through the ground layers,
    c) filling the holes with conductive material,
    d) milling off a first strip of the printed circuit board nearly down to the top signal layer to provide a strip of exposed signal contact pads on the top signal layer for the conductive traces thereon,
    e) milling off a second strip of the printed circuit board adjacent to the first strip nearly down to the intermediate ground layer to provide a strip of exposed ground contact pads on the intermediate ground layer, and
    f) milling off a third strip of the printed circuit board adjacent to the second strip nearly down to the bottom signal layer to provide a strip of exposed signal contact pads on the bottom signal layer for the conductive traces thereon.

7. The method of claim 6, wherein the steps of milling off strips of the printed circuit board provide a relatively wide first strip, an intermediate second strip and relatively narrow third strip.

8. A method of establishing signal and ground contacts on a multilayer printed circuit board having a ground layer, a signal layer, a ground layer, a signal layer and a ground layer in a stack-up configuration, top and bottom signal layers having signal pads and conductive traces leading away from the pads, the method comprising the steps of:

a) drilling blind signal holes in the printed circuit board down to signal pads on the signal layers,
   b) drilling through ground holes in the printed circuit board through the ground layers,
   c) filling the holes with conductive material,
   d) milling off a first strip of the printed circuit board nearly down to the top signal layer to provide a strip of exposed signal contact pads on the top signal layer for the conductive traces thereon,
   e) milling off a second strip of the printed circuit board adjacent to the first strip nearly down to the intermediate ground layer to provide a strip of exposed ground contact pads on the intermediate ground layer,
   f) milling off a third strip of the printed circuit board adjacent to the second strip nearly down to the bottom signal layer to provide a strip of exposed signal contact pads on the bottom signal layer for the conductive traces thereon, and
   g) providing the ground layers having signal holes passing through them with clearance areas around the signal holes if such clearance areas fall in portions of the printed circuit board that will not be milled off.

9. A multilayered printed circuit board having alternating ground and signal layers in a stack-up configuration with the signal layers having signal pads and conductive traces leading away from the pads, the printed circuit board having upper and lower outer surfaces, the printed circuit board having blind signal holes drilled down from the upper surface to the signal pads on each signal layer and through ground holes through each ground layer, the signal and ground holes being filled with conductive material, strips of the printed circuit board being milled away down to each signal and ground layer to provide exposed contacts.

10. A printed circuit board structure comprising a signal layer having conductive pads and conductive traces leading away from the pads and at least a second layer above the signal layer, the second layer having blind signal holes therein down to the signal pads on the signal layer, the blind signal holes being filled with conductive material, the second layer having portions removed down to the level of the signal layer leaving signal contacts on the signal layer for the conductive traces thereon.

* * * * *